(12) United States Patent
Kikuzuki et al.

(10) Patent No.: US 10,367,665 B2
(45) Date of Patent: Jul. 30, 2019

(54) RADIO ANALYZER AND DETECTING METHOD

(71) Applicant: FUJITSU LIMITED, Kawasaki-shi, Kanagawa (JP)

(72) Inventors: Tatsuya Kikuzuki, Sodegaura (JP); Teruhisa Ninomiya, Yokohama (JP)

(73) Assignee: FUJITSU LIMTED, Kawasaki (JP)

( * ) Notice: Subject to any disclaimer, the term of this patent is extended or adjusted under 35 U.S.C. 154(b) by 0 days.

(21) Appl. No.: 15/830,835

(22) Filed: Dec. 4, 2017

(65) Prior Publication Data

US 2018/0176050 A1    Jun. 21, 2018

(30) Foreign Application Priority Data

Dec. 21, 2016    (JP) .................. 2016-247418

(51) Int. Cl.

| H04L 7/04 | (2006.01) |
|---|---|
| H04L 27/00 | (2006.01) |
| H04B 1/713 | (2011.01) |
| H04B 1/709 | (2011.01) |
| H04B 1/7097 | (2011.01) |
| H04B 1/69 | (2011.01) |
| G01R 29/02 | (2006.01) |

(52) U.S. Cl.
CPC ......... *H04L 27/0012* (2013.01); *H04B 1/709* (2013.01); *H04B 1/7097* (2013.01); *H04B 1/713* (2013.01); *H04L 27/0008* (2013.01); *G01R 29/02* (2013.01); *H04B 1/69* (2013.01); *H04B 2001/6912* (2013.01); *H04B 2201/709709* (2013.01); *H04B 2201/71323* (2013.01); *H04L 7/04* (2013.01)

(58) Field of Classification Search
USPC ........................................................ 375/227
See application file for complete search history.

(56) References Cited

U.S. PATENT DOCUMENTS

| 2016/0173212 A1* | 6/2016 | Park ...................... H04B 17/345 375/227 |
|---|---|---|
| 2017/0303127 A1* | 10/2017 | Marquez ............... H04W 12/08 |
| 2018/0088231 A1* | 3/2018 | Morita .................. G01S 15/582 |

FOREIGN PATENT DOCUMENTS

| JP | 09-064846 | 3/1997 |
|---|---|---|
| JP | 2000-196687 | 7/2000 |
| JP | 2004-191090 | 7/2004 |

* cited by examiner

*Primary Examiner* — Eva Y Puente
(74) *Attorney, Agent, or Firm* — Fujitsu Patent Center

(57) ABSTRACT

A radio analyzer includes a memory configured to store a first reference signal, and a processor coupled to the memory and configured to calculate a first correlation value between a received wave and a non-modulated wave, calculate a second correlation value between the received wave and the first reference signal in a target section of the received wave, the first correlation value being smaller than a first threshold value in the target section, and detect a modulated wave from the received wave based on the second correlation value.

5 Claims, 19 Drawing Sheets

FIG. 4A
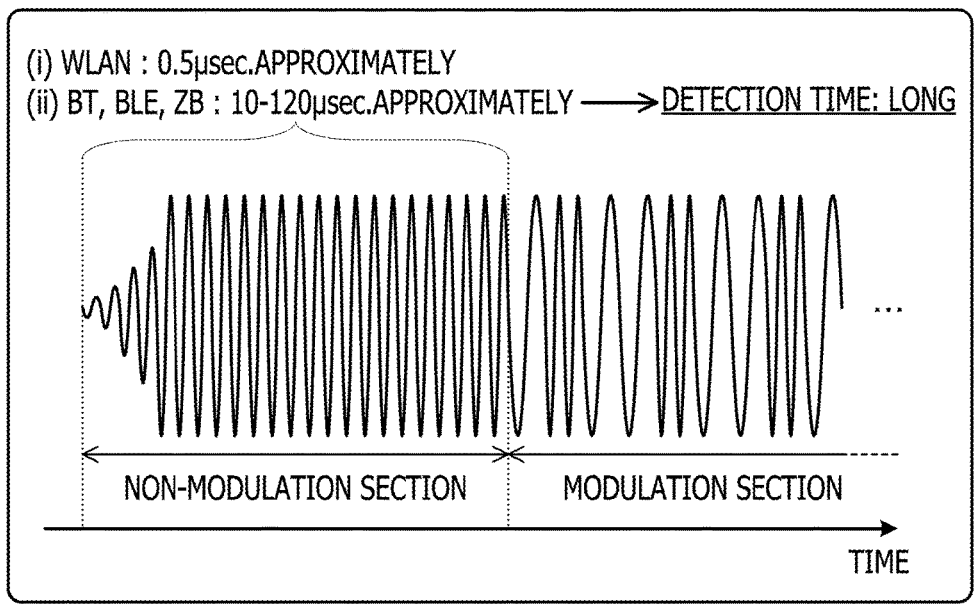
FIG. 4B
IDENTIFICATION OF MODULATION SECTION BASED ON SHORT PREAMBLE REFERENCE SIGNAL (S-RS) (COMPARATIVE EXAMPLE)
FIG. 4C
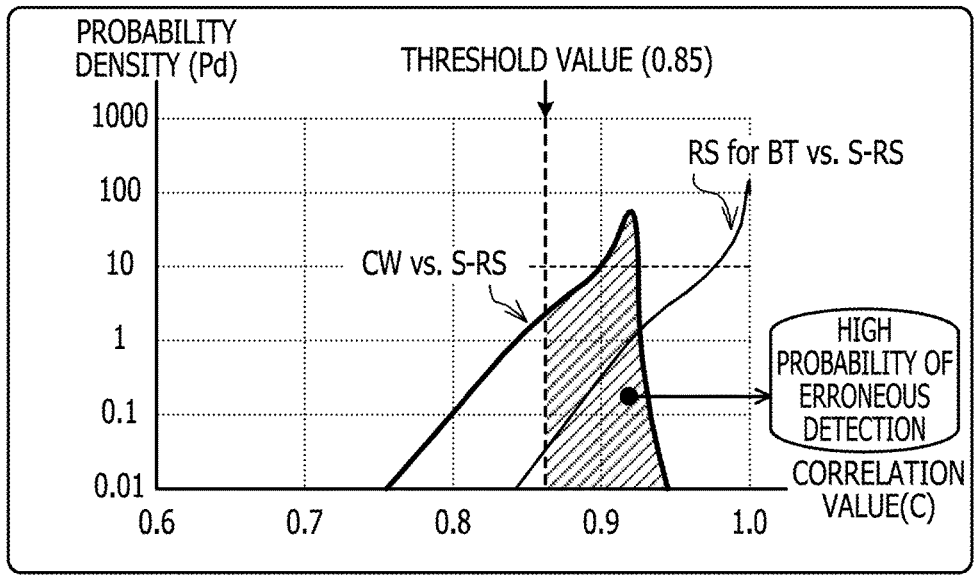

FIG. 7
| RADIO STANDARD | PREAMBLE REFERENCE SIGNAL (w) | |
|---|---|---|
| | BIT STRING | WAVEFORM (ex.FSK) |
| Reg#1 | 0011 | 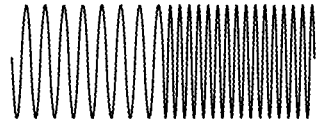 |
| Reg#2 | 0101 | 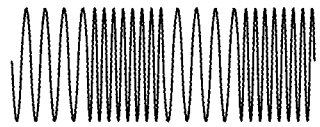 |
| Reg#3 | 0001 | 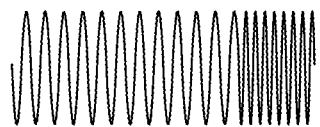 |
| Reg#4 | 1110 |  |

| THRESHOLD VALUE | VALUE | TARGET |
| --- | --- | --- |
| TH1 | 0.95 | CW CORRELATION |
| TH2 | 0.85 | RS CORRELATION |

RADIO ANALYZER AND DETECTING METHOD

CROSS-REFERENCE TO RELATED APPLICATION

This application is based upon and claims the benefit of priority of the prior Japanese Patent Application No. 2016-247418, filed on Dec. 21, 2016, the entire contents of which are incorporated herein by reference.

FIELD

The embodiments discussed herein are related to a radio analyzer and a detecting method.

BACKGROUND

When radio communication is performed, presence of an interfering radio wave is a factor in degrading communication quality. Therefore, a state of interference of the radio wave is monitored, and a measure to reduce the interference of the radio wave is taken. As the measure to reduce the interference, there is, for example, a method of controlling the output of the radio wave, a method of changing an installation location of an apparatus outputting the radio wave, or the like. An effective measure differs depending on properties of the interfering radio wave.

The properties of the radio wave depend on specifications defined in a radio standard, such as parameters used for modulation and a method of controlling the radio wave. It therefore becomes easy to find an effective measure to reduce the interference of the radio wave when the radio standard of the radio wave flying around in the air may be identified. Incidentally, radio standards include Bluetooth (registered trademark; hereinafter BT), Bluetooth low energy (BLE), wireless local area network (WLAN), and ZigBee (registered trademark; hereinafter ZB).

As a method of identifying a radio standard, there is, for example, a method of identifying a radio standard corresponding to a received wave by preparing preamble reference signals corresponding to respective radio standards, and evaluating cross-correlations between the received wave and the preamble reference signals. In this method, processing of calculating a cross-correlation value between the received wave and a preamble reference signal (sliding correlation operation) is executed on a section where the power of the received wave is equal to or higher than a certain value. When the section where the sliding correlation operation is executed is long, a long time is taken to detect a signal component (modulated wave) included in the received wave.

Radio standards such as BT, BLE, and ZB are adopted by many power saving devices. In these radio standards, a long non-modulation section than that of WLAN or the like is set with an intention of stabilizing a transmission signal. A non-modulation wave (continuous wave (CW)) is transmitted in a non-modulation section. Then, in a modulation section subsequent to the non-modulation section, a modulated wave corresponding to a radio standard (modulated wave including a known preamble signal) is transmitted. For example, a modulated wave modulated by a modulation system such as frequency shift-keying (FSK) is transmitted. The above-described sliding correlation operation is executed also on CW. Thus, when there is a long non-modulation section, unnecessary operation is increased.

Incidentally, a pulse analyzer is proposed which avoids a risk of a pulse detector mistaking CW for a pulse due to a transient variation in CW. This pulse analyzer prepares a threshold value for pulse detection and a threshold value for CW detection separately from each other, and uses the threshold value for CW detection when detecting CW. In addition, a method is proposed which identifies whether a received signal is binary phase modulated, non-modulated, chirp modulated, or frequency hopping modulated, and avoids unnecessary operation when the received signal is binary phase modulated or non-modulated. In addition, a code division multiple access (CDMA) receiving device is proposed which preferentially sets, as an object of orthogonalization, a received signal having a large product of a cross-correlation value between spread codes and a reception level.

Examples of the related art include Japanese Laid-open Patent Publication No. 2004-191090, Japanese Laid-open Patent Publication No. 2000-196687, and Japanese Laid-open Patent Publication No. 09-64846.

SUMMARY

According to an aspect of the embodiments, a radio analyzer includes a memory configured to store a first reference signal, and a processor coupled to the memory and configured to calculate a first correlation value between a received wave and a non-modulated wave, calculate a second correlation value between the received wave and the first reference signal in a target section of the received wave, the first correlation value being smaller than a first threshold value in the target section, and detect a modulated wave from the received wave based on the second correlation value.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 4A to 4C are diagrams of assistance in explaining a length of a CW section and CW-reference signal (RS) correlation;

FIG. 7 is a diagram illustrating an example of RS information according to the second embodiment;

FIG. 8 is a diagram illustrating an example of threshold value information according to the second embodiment;

DESCRIPTION OF EMBODIMENTS

In the sliding correlation operation described above, an operation load varies according to the length of the reference signal being used. For example, sliding correlation operation between a reference signal having a short signal length and a received wave has a lighter operation load than the sliding correlation operation using the preamble reference signal. A reduction in the operation load is expected when this nature is utilized by, for example, detecting a modulation section based on the reference signal having the short signal length as preprocessing and performing detection based on the preamble reference signal in the detected modulation section. However, the preamble signal of BT, BLE, or the like has a high correlation to CW. Thus, the use of the reference signal having the short signal length has a risk of failure to detect the modulation section.

The modulation section detection failure may be suppressed when a threshold value compared with a cross-correlation value is set low. However, setting the threshold value low increases a risk that the cross-correlation value exceeds the threshold value in a non-modulation section and that the non-modulation section is included in the modulation section detected as preprocessing. As a result, there is a risk that the ratio of sliding correlation operation for CW is increased in a stage of detection based on the preamble reference signal, and that a sufficient effect of shortening detection time may not be obtained even when preprocessing as described above is performed.

According to one aspect, it is an object of the present technology to provide a radio analyzer, a detecting method, and a program that may shorten detection time effectively.

Embodiments of the present technology will hereinafter be described with reference to the accompanying drawings. Incidentally, elements having essentially the same functions in the present specification and the drawings are identified by the same reference symbols, and repeated description thereof may be omitted.

1. First Embodiment

A first embodiment will be described with reference to FIG. 1. The first embodiment relates to a method by which a radio analyzer effectively shortens time of processing of detecting a modulation section of a received wave, the radio analyzer identifying radio standards based on received waves arriving from a plurality of radio devices transmitting signals of the different radio standards.

Figure 1:
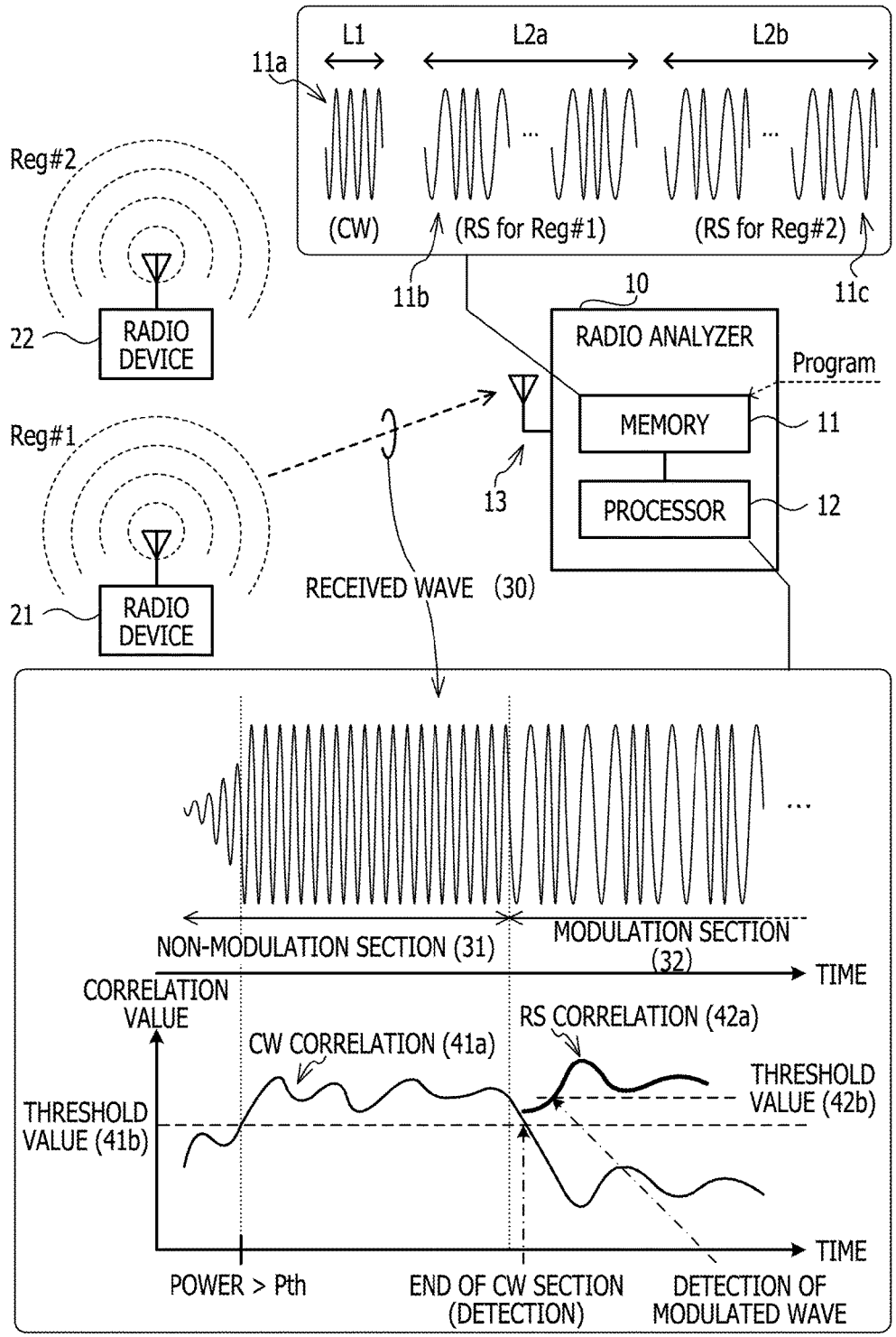
FIG. 1 is a diagram illustrating an example of a radio analyzer according to a first embodiment.

FIG. 1 is a diagram illustrating an example of a radio analyzer according to the first embodiment. Incidentally, a radio analyzer 10 illustrated in FIG. 1 is an example of the radio analyzer according to the first embodiment. In the example of FIG. 1, for the convenience of description, radio devices 21 and 22 are present around the radio analyzer 10, and the radio analyzer 10 is in a state of being able to receive radio waves output by the radio devices 21 and 22.

The radio devices 21 and 22 are, for example, a smart phone, a tablet terminal, a mobile telephone, a radio base station, a radio relay station, a personal computer (PC), or a machine type communication (MTC) terminal. In addition, the radio device 21 corresponds to a radio standard Reg#1. The radio device 22 corresponds to a radio standard Reg#2. Reg#1 and Reg#2 are, for example, BT, BLE, ZB, or WLAN.

As illustrated in FIG. 1, the radio analyzer 10 includes a memory 11, a processor 12, and an antenna 13.

The memory 11 is a volatile storage device such as a random access memory (RAM) or a nonvolatile storage device such as a hard disk drive (HDD), a flash memory, or the like. The processor 12 is a processor (processor/processor circuitry) such as a central processing unit (CPU), a digital signal processor (DSP), an application specific integrated circuit (ASIC), or a field programmable gate array (FPGA). The processor 12, for example, executes a program stored in the memory 11 or another memory.

The memory 11 stores information about a first reference signal having a first length. For example, the memory 11 stores, as the information about the first reference signal, information about a preamble reference signal 11b having a length L2a and a preamble reference signal 11c having a length L2b. The lengths L2a and L2b are an example of the first length.

The preamble reference signal 11b is a reference signal of a waveform corresponding to a known preamble signal defined by Reg#1. The preamble reference signal 11c is a reference signal of a waveform corresponding to a known preamble signal defined by Reg#2. The memory 11 stores information about a non-modulated wave (CW) 11a of a length L1 (L1<L2a and L1<L2b).

When a modulated wave of Reg#1 is included in a received wave, for example, a cross-correlation value between the received wave and the preamble reference signal 11b exceeds a given reference value. When a modulated wave of Reg#2 is included in a received wave, on the other hand, a cross-correlation value between the received wave and the preamble reference signal 11c exceeds the given reference value. By utilizing this nature, it is possible to determine to which of Reg#1 and Reg#2 a modulated wave included in a received wave corresponds.

When the radio analyzer 10 receives a radio wave (received wave 30) output from the radio device 21 as in FIG. 1, the processor 12 calculates a first correlation value between the received wave 30 and the non-modulated wave 11a. The received wave 30 includes a non-modulation section 31 (section of CW) and a modulation section 32 (section including a modulated wave) following the non-modulation section 31.

In the non-modulation section 31, a correlation (CW correlation 41a) between the received wave 30 and the non-modulated wave 11a is high. In the modulation section 32, on the other hand, the CW correlation 41a is low. Utilizing this nature, the processor 12 starts to calculate the CW correlation 41a at a time point at which the power of the received wave 30 exceeds a fixed value Pth, and detects a time point at which the calculated value of the CW correlation 41a becomes equal to or less than a given threshold value 41b. Incidentally, the calculated value of the CW correlation 41a is an example of the first correlation value.

In addition, the processor 12 calculates a second correlation value between the received wave 30 and the first reference signal in a target section of the received wave 30 in which target section the first correlation value is smaller than a first threshold value. In the example of FIG. 1, the processor 12 sets the threshold value 41b as the first threshold value, and sets a section subsequent to the time point that the calculated value of the CW correlation 41a becomes equal to or less than the threshold value 41b as the above-described target section. In addition, the processor 12 calculates a correlation (RS correlation 42a) between the received wave 30 and the preamble reference signal 11b in the target section. Incidentally, the calculated value of the RS correlation 42a is an example of the second correlation value.

In addition, the processor 12 detects a modulated wave from the received wave 30 based on the second correlation value. In the example of FIG. 1, the radio wave of the radio device 21 corresponding to Reg#1 arrives as the received wave 30 at the radio analyzer 10. Thus, the RS correlation 42a between the preamble reference signal 11b corresponding to Reg#1 and the received wave 30 exceeds a given threshold value (threshold value 42b). In this case, the processor 12 determines that a modulated wave corresponding to Reg#1 is included in the received wave 30. Incidentally, when no modulated wave is detected based on the preamble reference signal 11b, the processor 12 detects a modulated wave included in the received wave 30 using the preamble reference signal 11c.

Processing time taken for detection is effectively shortened by detecting an end point of the non-modulation section 31 using the non-modulated wave 11a and narrowing down a section for executing sliding correlation operation based on the preamble reference signals 11b and 11c having a longer signal length than the non-modulated wave 11a, as described above. This effect is increased as the non-modulation section 31 is lengthened. In addition, because the non-modulated wave 11a is used to detect the target section, the risk of failing to detect the modulation section may be reduced.

When noise is superimposed on a modulated wave, for example, the waveform of the modulated wave is disturbed, and therefore the correlation between the modulated wave and a preamble reference signal tends to be low. On the other hand, even when the waveform of CW is disturbed by noise, there is a small possibility of a decrease in the correlation between CW and the preamble reference signal. Therefore, the risk of detection failure is increased when an adjustment that lowers the threshold value used to detect the modulated wave is not made. On the other hand, even when the waveform of the modulated wave is disturbed by noise, there is a small possibility of an increase in the correlation between the modulated wave and CW, and therefore there is a limited effect on the risk of detection failure.

Because of the nature as described above, the target section may be narrowed down by using a short non-modulated wave while the risk of detection failure is suppressed. As a result, as compared with a case where sliding correlation operation is executed using a preamble reference signal from a start of a received wave including a non-modulation section, time taken for the operation may be shortened. In addition, when the risk of detection failure is the same, adopting the above-described method of using the non-modulated wave 11a may shorten operation time as compared with a method of narrowing down the target section using a short preamble reference signal. In conclusion, detection time may be shortened effectively by applying the technology of the first embodiment.

The first embodiment has been described above.

2. Second Embodiment

A second embodiment will next be described. The second embodiment relates to a method by which a radio analyzer effectively shortens time of processing of detecting a modulation section of a received wave, the radio analyzer identifying radio standards based on received waves arriving from a plurality of radio devices transmitting signals of the different radio standards.

2-1. System

Figure 2:
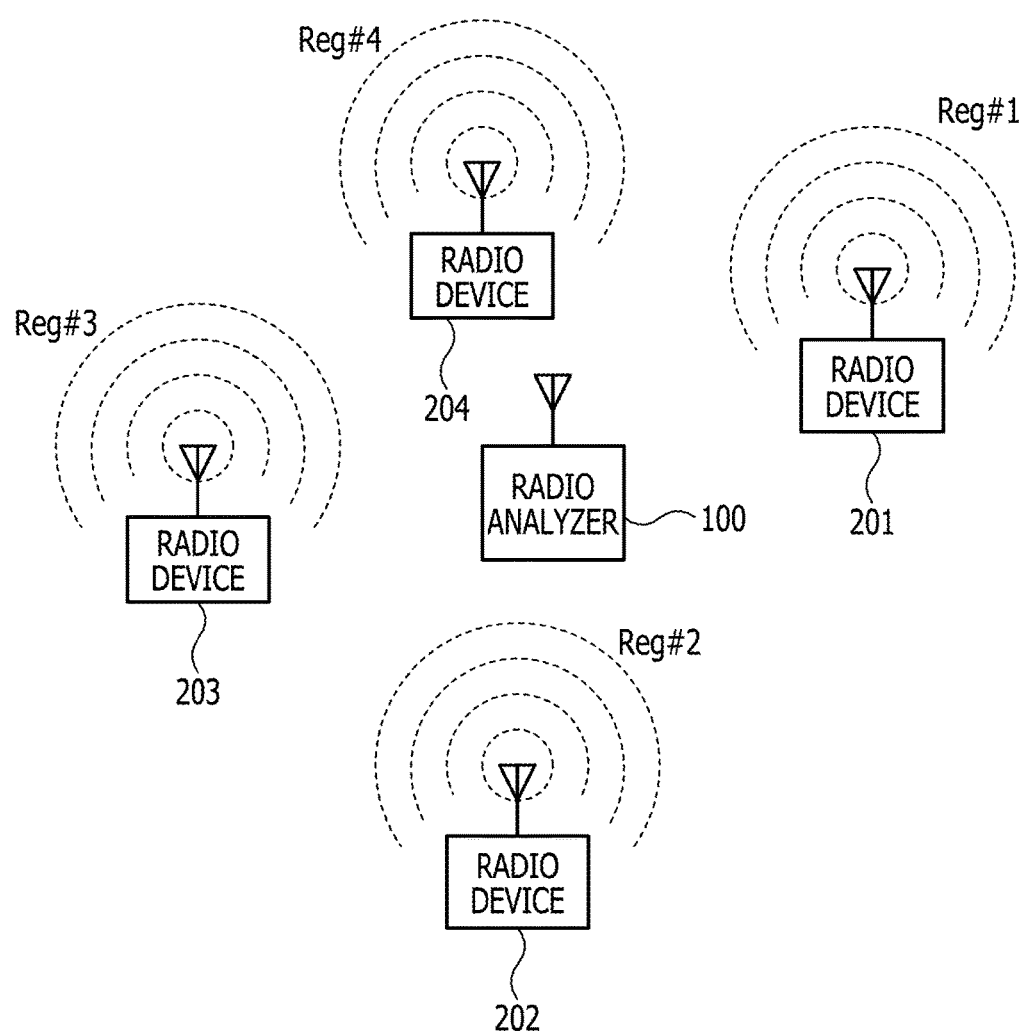
FIG. 2 is a diagram illustrating an example of a system according to a second embodiment.

A system according to the second embodiment will be described with reference to FIG. 2. FIG. 2 is a diagram illustrating an example of a system according to a second embodiment.

It is to be noted that the system illustrated in FIG. 2 is an example, and that, for example, the number of radio devices, kinds of radio standards, or the range of devices included in one radio communication system may be modified. However, in the following, for the convenience of description, the description will be made by taking the system illustrated in FIG. 2 as an example.

The system illustrated in FIG. 2 includes a radio analyzer 100 and radio devices 201, 202, 203, and 204. The radio analyzer 100 is a computer including an antenna for receiving a radio wave. The radio devices 201, 202, 203, and 204 are, for example, a smart phone, a tablet terminal, a mobile telephone, a radio base station, a radio relay station, a PC, or an MTC terminal. The radio devices 201, 202, 203, and 204 correspond to radio standards Reg#1, Reg#2, Reg#3, and Reg#4, respectively. Reg#1, Reg#2, Reg#3, and Reg#4 are, for example, BT, BLE, ZB, or WLAN.

The radio analyzer 100 receives a radio wave output from at least one of the radio devices 201, 202, 203, and 204, analyzes the received radio wave (incoming wave), and identifies the radio standard of a signal included in the incoming wave. At this time, the radio analyzer 100 calculates correlation values between a plurality of preamble reference signals (RS) corresponding to each of Reg#1, Reg#2, Reg#3, and Reg#4, and the incoming wave, and identifies the radio standard based on the correlation values.

Figure 3:
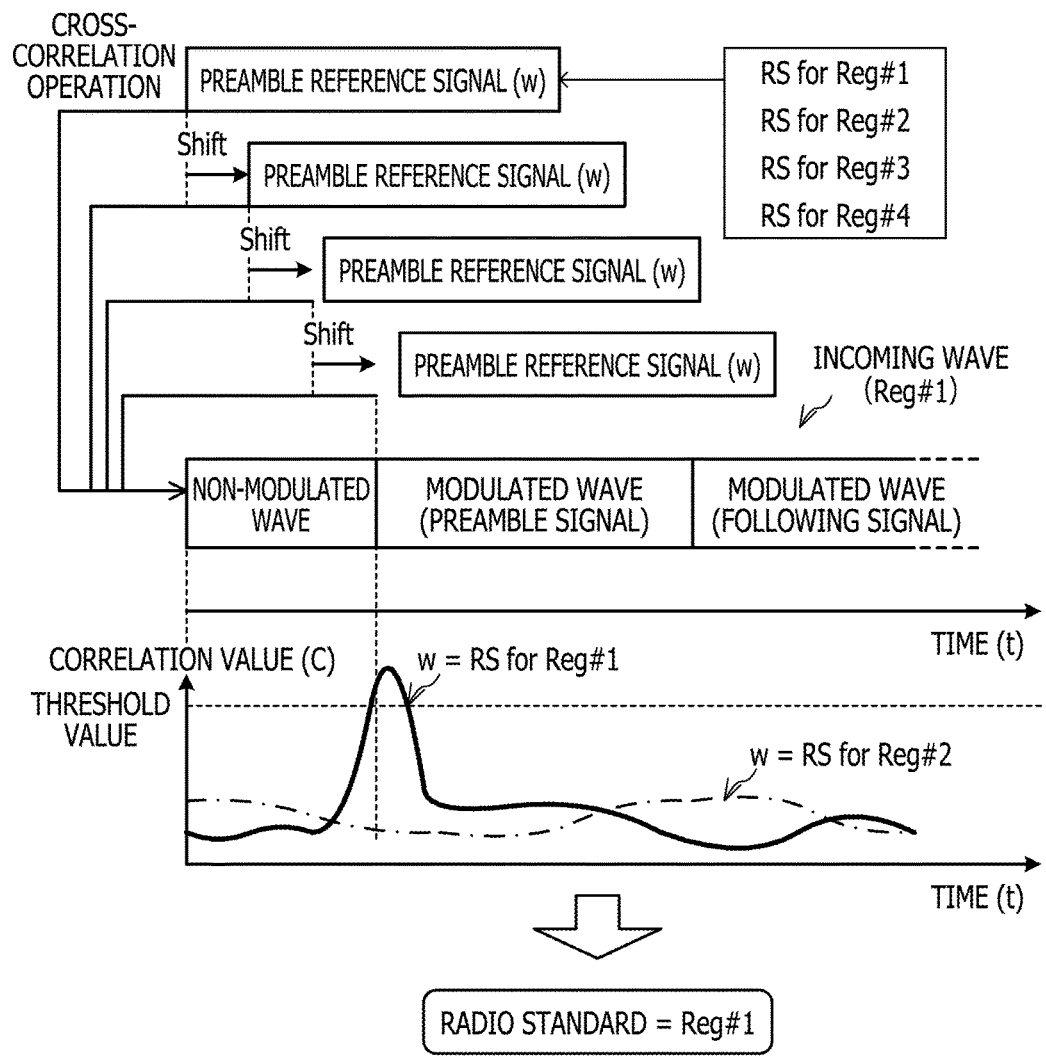
FIG. 3 is a diagram of assistance in explaining identification of a radio standard.

Sliding correlation operation is performed by a method as illustrated in FIG. 3, for example. FIG. 3 is a diagram of assistance in explaining identification of a radio standard.

When a preamble reference signal is represented as w, the incoming wave is represented as s, and the length of the preamble reference signal is represented as N, a correlation value C(t) at time t is given by a convolution operation equation illustrated in the following Equation (1). Incidentally, suppose that a sampling interval dt is fixed ($\tau=n \times dt$).

[Expression 1]

$$C(t)=(w*s)(t)=\Sigma_{n=0}^{N}w(\tau)s(t-\tau), \tau=n \times dt \quad (1)$$

As illustrated in FIG. 3, the incoming wave includes a section of a non-modulated wave (CW) and a section of a modulated wave. The section of the modulated wave includes a preamble signal, which is a known signal. As an example, a solid line graph (w=RS for Reg#1) of FIG. 3 is obtained when the correlation value C(t) between the incoming wave corresponding to Reg#1 and the preamble reference signal of Reg#1 is calculated based on the above Equation (1). On the other hand, a single-dot chain line graph (w=RS for Reg#2) of FIG. 3 is obtained when the correlation value C(t) between the incoming wave corresponding to Reg#1 and the preamble reference signal of Reg#2 is calculated.

The solid line graph of FIG. 3 indicates that the correlation value C exceeds a threshold value in a first half section of the modulated wave. The single-dot chain line graph of FIG. 3, on the other hand, indicates that the correlation value C does not exceed the threshold value in the entire section. For example, a preamble signal having the same waveform as the preamble reference signal (RS for Reg#1) may be said to be included in the incoming wave, and the radio standard of the signal included in the incoming wave is identified as Reg#1 in the example of FIG. 3. The radio standard may be identified by such a method. However, in the case of the method illustrated in FIG. 3, correlation operation on the non-modulated wave occurs, and there is thus a waste of operation.

When there is a long non-modulation section as illustrated in FIG. 4A, for example, the waste of operation is increased, and therefore detection time is lengthened. FIGS. 4A to 4C are diagrams of assistance in explaining a length of a CW section and CW-RS correlation. In the case of WLAN, the length of a non-modulation section is approximately 0.5 microseconds. In the case of a radio standard such as BT, BLE, or ZB adopted by a power saving device, on the other hand, a non-modulation section has a long length of approximately 10 microseconds to 120 microseconds, and there is thus a large waste of operation. In addition, when the reference signal used for the correlation operation has a long signal length, an operation load is increased.

In regard to the shortening of detection time, as illustrated in FIG. 4B, for example, a method (comparative example) is conceivable which, as preprocessing, identifies a modulation section using a part (S-RS) of a preamble reference signal, and performs detection processing only on the identified modulation section based on the whole of the preamble reference signal. Performing such preprocessing may avoid a waste of detecting operation based on a long preamble reference signal, and contribute to shortening of detection time. However, when the correlation between the preamble reference signal and CW is high, there is a risk of occurrence of modulation section detection failure in the above-described preprocessing.

For example, the distribution of probability density Pd in which a correlation value between CW and S-RS is the correlation value C is as in a graph represented by a thick line in FIG. 4C. For example, this graph illustrates probability density distribution in a case where the correlation value C between CW and S-RS is calculated for an incoming wave including only CW (CW incoming wave). As an example, a probability of the correlation value C being larger than 0.85 in this graph corresponds to a hatched area (approximately 92%: note that an axis of ordinates is on a logarithmic scale). Incidentally, the distribution of probability density Pd in which a correlation value between a preamble signal (in the case of BT; RS for BT) and S-RS is the correlation value C is as in a graph represented by a thin line in FIG. 4C.

In the example of FIG. 4C, the correlation value C of S-RS exceeds the threshold value with a high probability in response to the arrival of CW, and therefore CW is erroneously detected as a modulation section with a high probability. When the threshold value is set to a large value, on the other hand, a probability that the correlation value C between the preamble signal and S-RS does not exceed the threshold value is increased, and thus the risk of modulation section detection failure is increased.

In conclusion, in the case of a radio standard in which the correlation between CW and S-RS is high, even when preprocessing using S-RS is added, sliding correlation operation based on a long preamble reference signal is executed for a non-modulation section erroneously detected as a modulation section, and thus unnecessary operation is reduced by a small amount. Accordingly, the radio analyzer 100 according to the second embodiment identifies a modulation section using CW, and executes sliding correlation operation on the identified modulation section based on a long preamble reference signal. The radio analyzer 100 will be further described in the following.

2-2. Hardware

Figure 5:
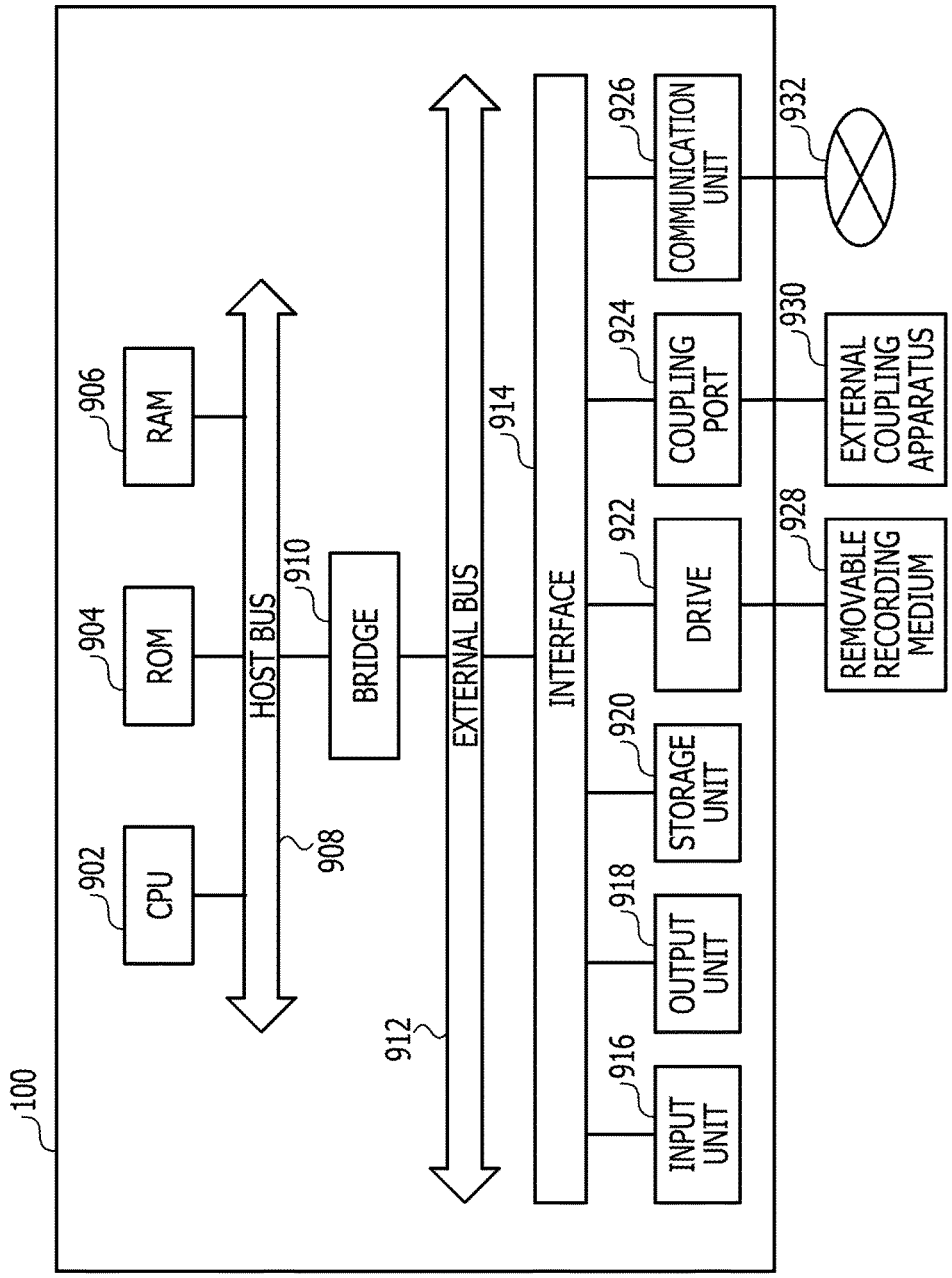
FIG. 5 is a block diagram illustrating an example of hardware that may implement functions of a radio analyzer according to the second embodiment.

First, referring to FIG. 5, description will be made of hardware that may implement functions of the radio analyzer 100. FIG. 5 is a block diagram illustrating an example of hardware that may implement functions of a radio analyzer according to the second embodiment.

The functions the radio analyzer 100 has may be implemented using hardware resources illustrated in FIG. 5, for example. For example, the functions the radio analyzer 100 has are implemented by controlling hardware illustrated in FIG. 5 using a computer program.

As illustrated in FIG. 5, the hardware mainly includes a CPU 902, a read only memory (ROM) 904, a RAM 906, a host bus 908, and a bridge 910. The hardware further includes an external bus 912, an interface 914, an input unit 916, an output unit 918, a storage unit 920, a drive 922, a coupling port 924, and a communicating unit 926.

The CPU 902, for example, functions as an arithmetic processing device or a control device, and controls the whole or part of operation of each constituent element based on various kinds of programs recorded in the ROM 904, the RAM 906, the storage unit 920, or a removable recording medium 928. The ROM 904 is an example of a storage device that stores a program read by the CPU 902, data used for arithmetic operation, and the like. The RAM 906, for example, temporarily or permanently stores the program read by the CPU 902 and various kinds of parameters changing when the program is executed.

These elements are, for example, mutually coupled via the host bus 908 capable of high speed data transmission. The host bus 908 is coupled to the external bus 912 having a relatively low data transmission speed via the bridge 910, for example. In addition, used as the input unit 916 are, for example, a mouse, a keyboard, a touch panel, a touch pad, a button, a switch, and a lever.

Usable as the output unit 918 is, for example, a display device such as a cathode ray tube (CRT), an liquid crystal display (LCD), a plasma display panel (PDP), or an electroluminescence display (ELD). Also usable as the output unit 918 is a printer or the like.

The storage unit 920 is a device for storing various kinds of data. Used as the storage unit 920 is, for example, a magnetic storage device such as an HDD. In addition, a semiconductor storage device such as a solid state drive (SSD) or a RAM disk, an optical storage device, or a magneto-optical storage device may also be used as the storage unit 920.

The drive 922 is a device that reads information recorded on the removable recording medium 928 as a recording medium capable of being inserted and removed, or which writes information to the removable recording medium 928. Used as the removable recording medium 928 is, for example, a magnetic disk, an optical disk, a magneto-optical disk, or a semiconductor memory. The removable recording medium 928 may store a program defining operation of the radio analyzer 100 or the like.

The coupling port 924 is, for example, a port for coupling an external coupling apparatus 930, the port being a universal serial bus (USB) port, an Institute of Electrical and Electronics Engineers (IEEE) 1394 port, a small computer system interface (SCSI) port, an RS-232C port, an optical audio terminal, or the like. Used as the external coupling apparatus 930 is, for example, a printer.

The communicating unit 926 is a communication device for coupling to a network 932. Used as the communicating unit 926 is, for example, a communication circuit for a wired or wireless LAN, a communication circuit for wireless USB (WUSB), a communication circuit or a router for optical communication, a communication circuit or a router for asymmetric digital subscriber line (ADSL), a communication circuit for a mobile telephone network, or the like. The network 932 coupled to the communicating unit 926 is a network coupled by wire or radio, and includes, for example, the Internet and a LAN. In addition, an antenna (not illustrated) is coupled to the communicating unit 926. The communicating unit 926 receives a radio wave via the antenna.

The hardware of the radio analyzer 100 has been described above. It is to be noted that the above-described hardware is an example, and is susceptible of modifications in which a part of the elements are omitted, modifications in which a new element is added, and the like.

2-3. Functions of Radio Analyzer

Figure 6:
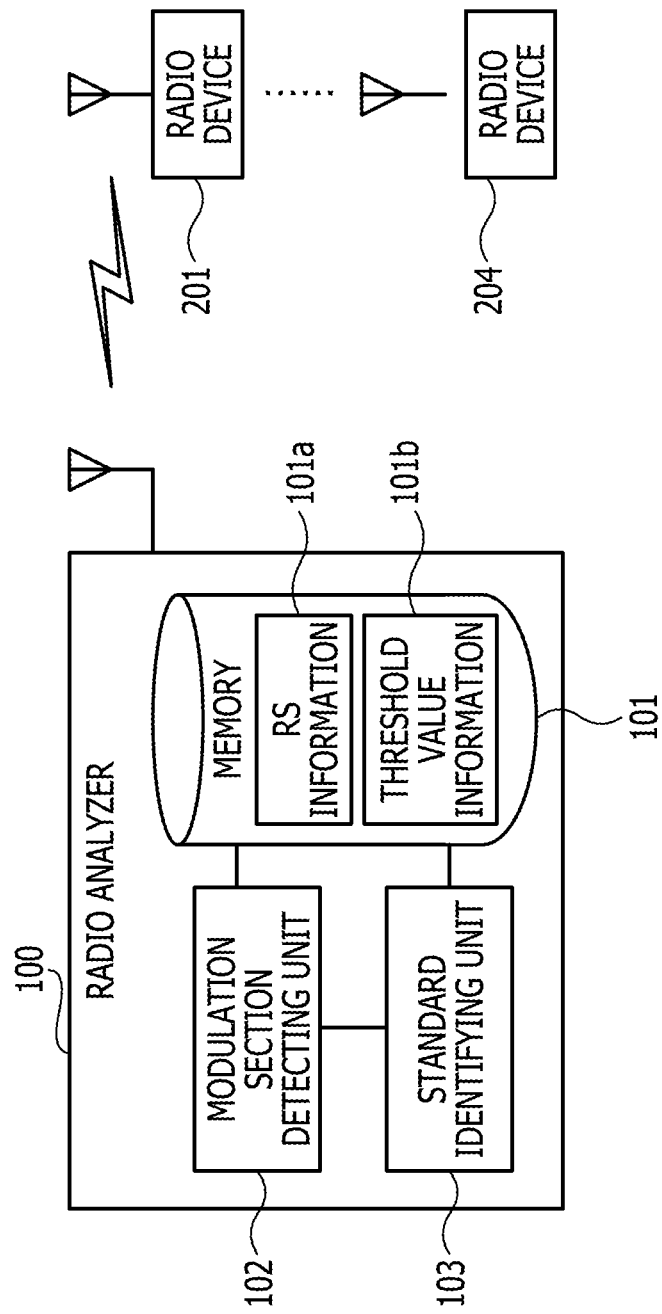
FIG. 6 is a block diagram illustrating an example of functions a radio analyzer according to the second embodiment has.

Functions of the radio analyzer 100 will next be described with reference to FIG. 6. FIG. 6 is a block diagram illustrating an example of functions a radio analyzer according to the second embodiment has.

As illustrated in FIG. 6, the radio analyzer 100 includes a memory 101, a modulation section detecting unit 102, and a standard identifying unit 103. Incidentally, functions of the memory 101 may be implemented by using the RAM 906 or the storage unit 920 described above or the like. Functions of the modulation section detecting unit 102 and the standard identifying unit 103 may be implemented by using the CPU 902 described above or the like.

The memory 101 stores RS information 101*a* and threshold value information 101*b*.

As illustrated in FIG. 7, the RS information 101*a* includes information about preamble reference signals defined in respective radio standards. FIG. 7 is a diagram illustrating an example of RS information according to the second embodiment. Incidentally, FIG. 7 illustrates, as the information about the preamble reference signals, bit strings and waveforms (in a case where a modulation system is FSK) corresponding to the bit strings. The details of the RS information 101*a* illustrated in FIG. 7 are an example. The RS information 101*a* may include information about the modulation system, usage frequency, and the like as information corresponding to the waveforms.

As illustrated in FIG. 8, the threshold value information 101*b* includes the value of a threshold value TH1 used when a modulation section is detected using the correlation between an incoming wave and CW (CW correlation). The threshold value information 101*b* also includes the value of a threshold value TH2 used when a modulated wave is detected using the correlation between the incoming wave and a preamble reference signal (RS correlation). FIG. 8 is a diagram illustrating an example of threshold value information according to the second embodiment. The threshold values TH1 and TH2 are, for example, set according to a tolerable modulated wave detection failure rate. In addition, the threshold value TH1 is set at a value larger than the threshold value TH2.

Figure 9:
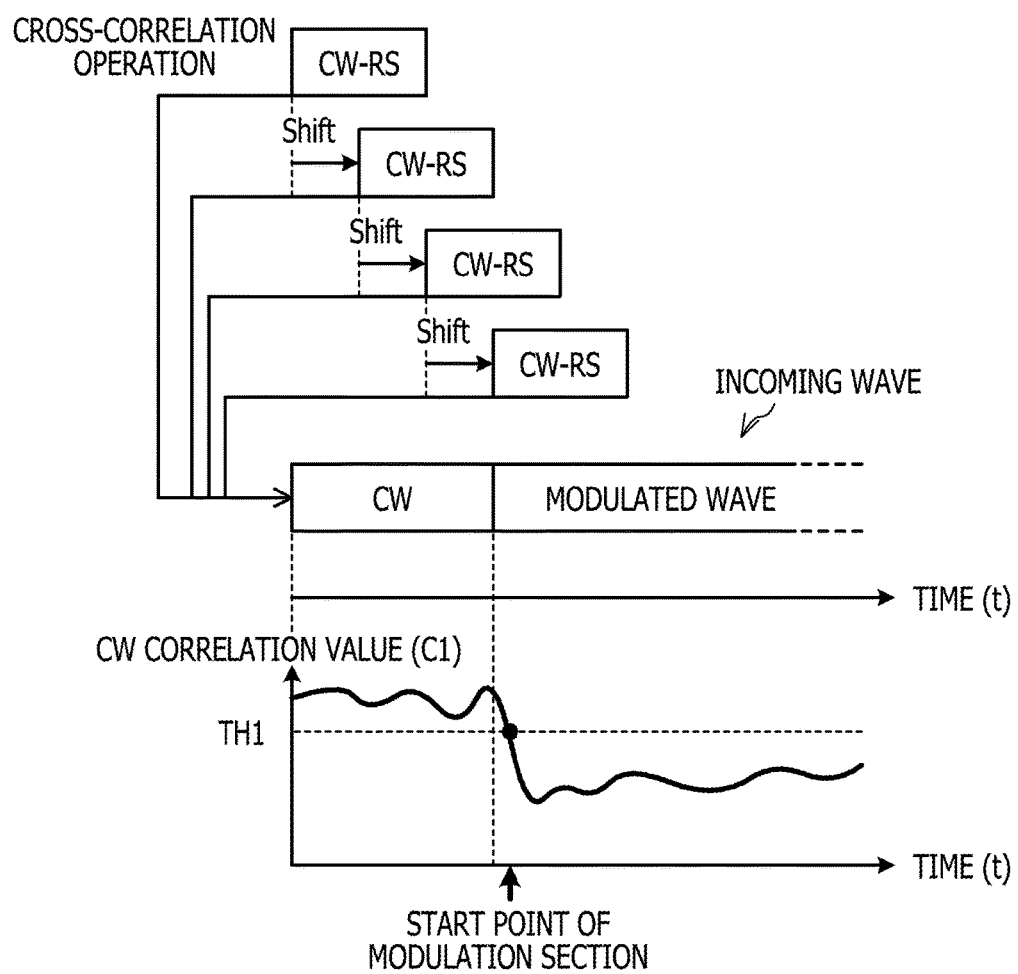
FIG. 9 is a diagram of assistance in explaining detection of a modulation section according to the second embodiment.

The modulation section detecting unit 102 identifies the modulation section of an incoming wave using a reference signal (CW-RS) having the waveform of CW. As illustrated in FIG. 9, for example, the modulation section detecting unit 102 executes sliding correlation operation while shifting the position of CW-RS in order from a start of the incoming wave, and compares a correlation value C1 (CW correlation value) and the threshold value TH1 with each other. FIG. 9 is a diagram of assistance in explaining detection of a modulation section according to the second embodiment.

When the correlation value C1 falls below the threshold value TH1, the modulation section detecting unit 102 identifies a time point at which the correlation value C1 and the threshold value TH1 intersect each other as a start point of a modulation section. Incidentally, while FIG. 9 illustrates a graph of the correlation value C1 with respect to a modulated wave for the convenience of description, the modulation section detecting unit 102 may end the calculation of the CW correlation value at the time point at which the start point of the modulation section is identified.

Figure 10:
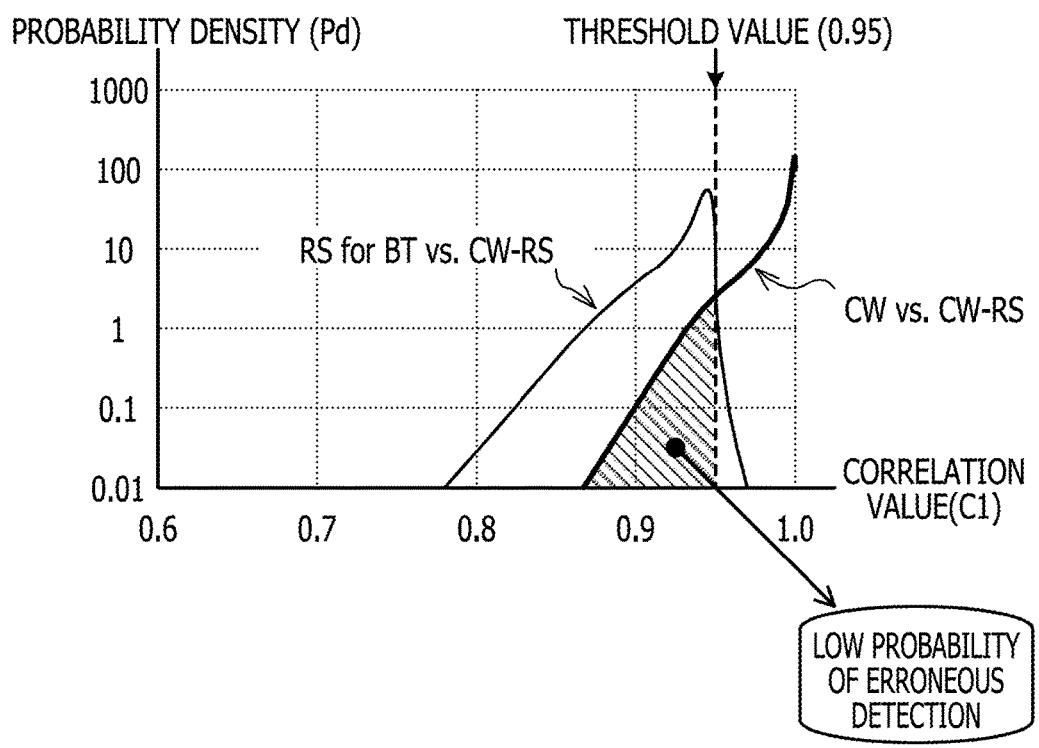
FIG. 10 is a diagram illustrating probability density distributions with respect to a correlation value between a preamble reference signal of BT and CW-RS and a correlation value between CW and CW-RS.

A modulated wave detection failure rate in a case where the CW correlation is used will be described in the following with reference to FIG. 10. FIG. 10 is a diagram illustrating probability density distributions with respect to a correlation value between a preamble reference signal of BT and CW-RS and a correlation value between CW and CW-RS.

A graph of a thick line in FIG. 10 is the probability density distribution with respect to the correlation between a CW incoming wave and CW-RS. A probability of the correlation value C1 being smaller than the threshold value TH1 (0.95) in this graph corresponds to the area of a hatched part (approximately 4%; note that an axis of ordinates is on a logarithmic scale). In addition, a graph of a thin line in FIG. 10 represents the probability density distribution with respect to the correlation between the preamble signal of BT and CW-RS. A probability of the correlation value C1 being larger than the threshold value TH1 in this graph is small, for example, approximately 0.1% or less.

By thus using the CW correlation for the detection of a modulation section, it is possible to suppress both a probability of erroneously detecting a modulation section as a non-modulation section and a probability of erroneously detecting a non-modulation section as a modulation section.

Figure 11:
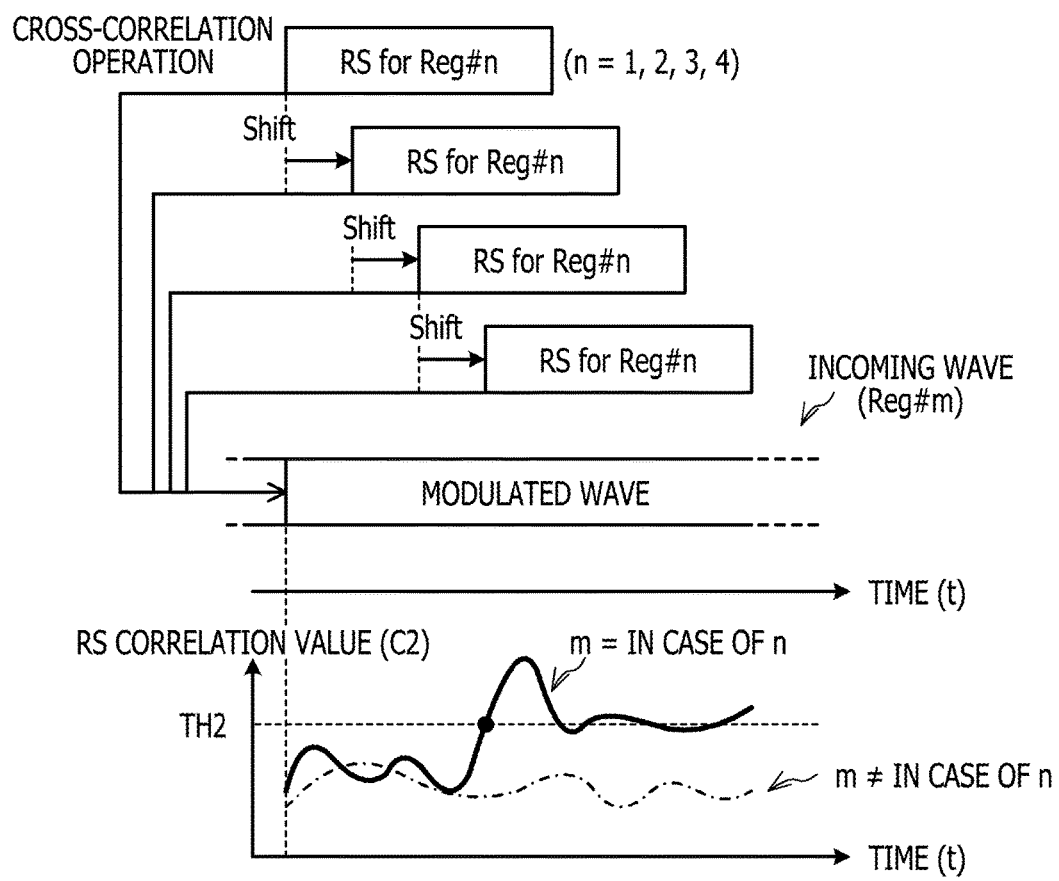
FIG. 11 is a diagram of assistance in explaining identification of a radio standard according to the second embodiment.

As illustrated in FIG. 11, the standard identifying unit 103 calculates an RS correlation value C2 in the modulation section detected by the modulation section detecting unit 102. FIG. 11 is a diagram of assistance in explaining identification of a radio standard according to the second embodiment. The standard identifying unit 103 refers to the RS information 101a, calculates the RS correlation value C2 using a preamble reference signal corresponding to each radio standard, and compares the RS correlation value C2 and the threshold value TH2 with each other. When the RS correlation value C2 exceeds the threshold value TH2, the standard identifying unit 103 determines that a signal of the radio standard corresponding to the RS correlation value C2 is included in the incoming wave.

Figure 12:
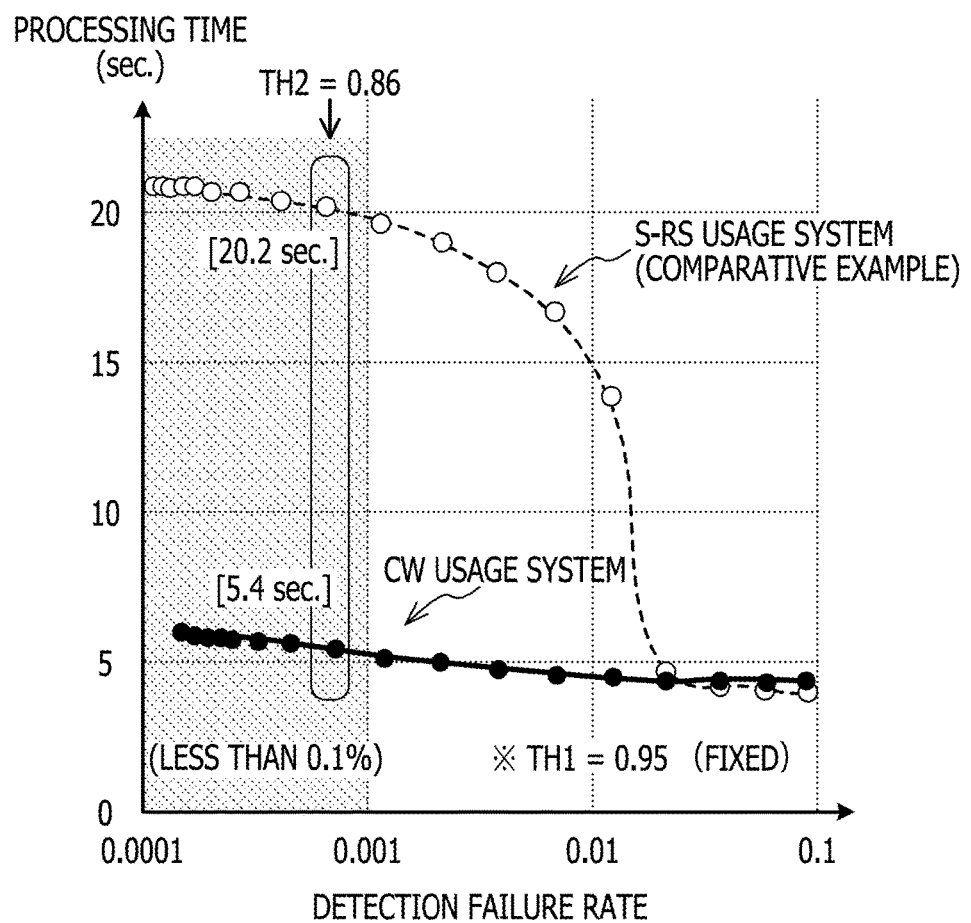
FIG. 12 is a diagram comparing a time of detection processing according to the second embodiment with a time of detection processing according to a comparative example.

When the modulated wave detection failure rate was set at approximately 0.1%, as illustrated in FIG. 12, a time taken for detection processing was 5.4 seconds in the system of the second embodiment using the CW correlation (CW usage system), and was 20.2 seconds in the system of the comparative example (S-RS usage system). FIG. 12 is a diagram comparing a time of detection processing according to the second embodiment with a time of detection processing according to a comparative example. Incidentally, the detection failure rate in the S-RS usage system corresponds to the threshold value used to detect a modulation section based on S-RS (see FIGS. 4A to 4C). On the other hand, the detection failure rate in the CW usage system corresponds to the threshold value TH2 in a state in which the threshold value TH1 is fixed at 0.95.

As described above, when the CW usage system of the second embodiment is adopted, the processing time taken to detect a modulated wave may be shortened even as compared with the S-RS usage system.

Functions of the radio analyzer 100 have been described above.

2-4. Flow of Processing

Figure 13:
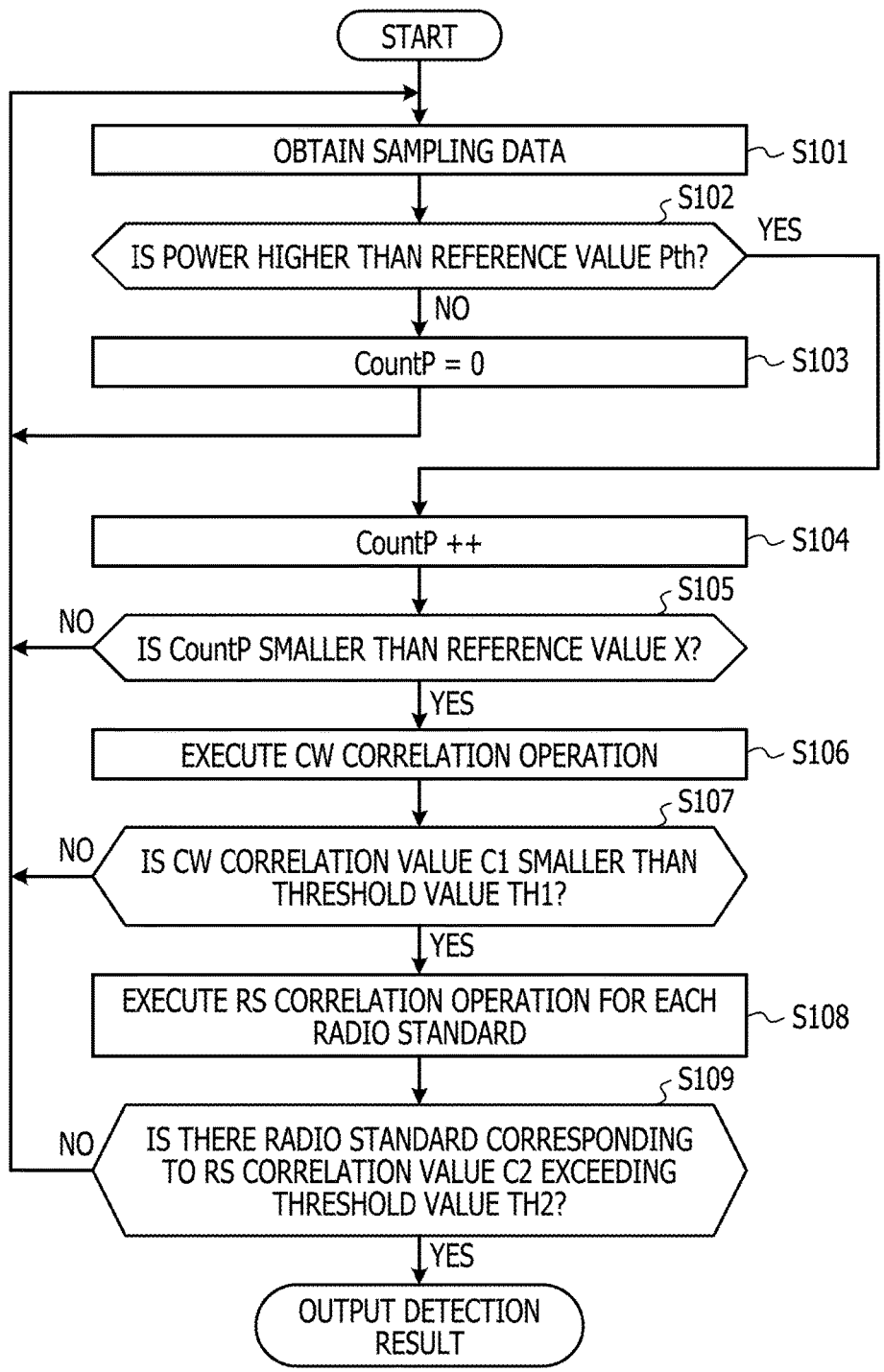
FIG. 13 is a flowchart illustrating a flow of processing performed by a radio analyzer according to the second embodiment.

A flow of processing performed by the radio analyzer 100 will next be described with reference to FIG. 13. FIG. 13 is a flowchart illustrating a flow of processing performed by a radio analyzer according to the second embodiment.

(S101) The modulation section detecting unit 102 obtains the power value of an incoming wave as sampling data while shifting a sampling section.

(S102) The modulation section detecting unit 102 determines whether or not the power value (Power) is larger than a reference value Pth set in advance. The reference value Pth is set by using, as a reference, a power value in a state in which the output of the transmission signal is stabilized, for example. When the power value is larger than the reference value Pth, the processing proceeds to S104. When the power value is not larger than the reference value Pth, on the other hand, the processing proceeds to S103.

(S103) The modulation section detecting unit 102 resets, to zero, a parameter CountP used to determine a section in which the power value determination is made. When the processing of S103 is completed, the processing proceeds to S101.

(S104) The modulation section detecting unit 102 increments CountP by one.

(S105) The modulation section detecting unit 102 determines whether or not CountP is smaller than a reference value X. The reference value X is a parameter defining the time-out number of samplings (for example, the number of samplings corresponding to approximately 120 microseconds (maximum length of a non-modulation section)). When CountP is smaller than the reference value X, the processing proceeds to S106. When CountP is not smaller than the reference value X, on the other hand, the processing proceeds to S101.

(S106 and S107) The modulation section detecting unit 102 calculates the CW correlation value C1 by executing the CW correlation operation (see FIG. 9). In addition, the modulation section detecting unit 102 determines whether or not the CW correlation value C1 is smaller than the threshold value TH1 (for example, 0.95). When the CW correlation value C1 is smaller than the threshold value TH1, the processing proceeds to S108. When the CW correlation value C1 is not smaller than the threshold value TH1, on the other hand, the processing proceeds to S101.

(S108 and S109) The standard identifying unit 103 refers to the RS information 101a, and calculates the RS correlation value C2 by executing RS correlation operation for each radio standard (see FIG. 11). In addition, the standard identifying unit 103 determines whether or not there is a radio standard corresponding to the RS correlation value C2 exceeding the threshold value TH2 (for example, 0.85). When there is a radio standard corresponding to the RS correlation value C2 exceeding the threshold value TH2, the standard identifying unit 103 outputs, as a result of detection, information about the radio standard corresponding to the RS correlation value C2 exceeding the threshold value TH2. When there is no radio standard corresponding to the RS correlation value C2 exceeding the threshold value TH2, on the other hand, the processing proceeds to S101.

A flow of processing performed by the radio analyzer 100 has been described above.

2-5. Modification Examples

Modification examples of the second embodiment will be described in the following.

Modification Example #1: Addition of Determination Based on Short Preamble Reference Signal The description thus far has been made of a method of identifying a modulation section based on the CW correlation. However, a modification (modification example #1) is also possible in which determination processing based on S-RS correlation is added to this method.

Figure 14:
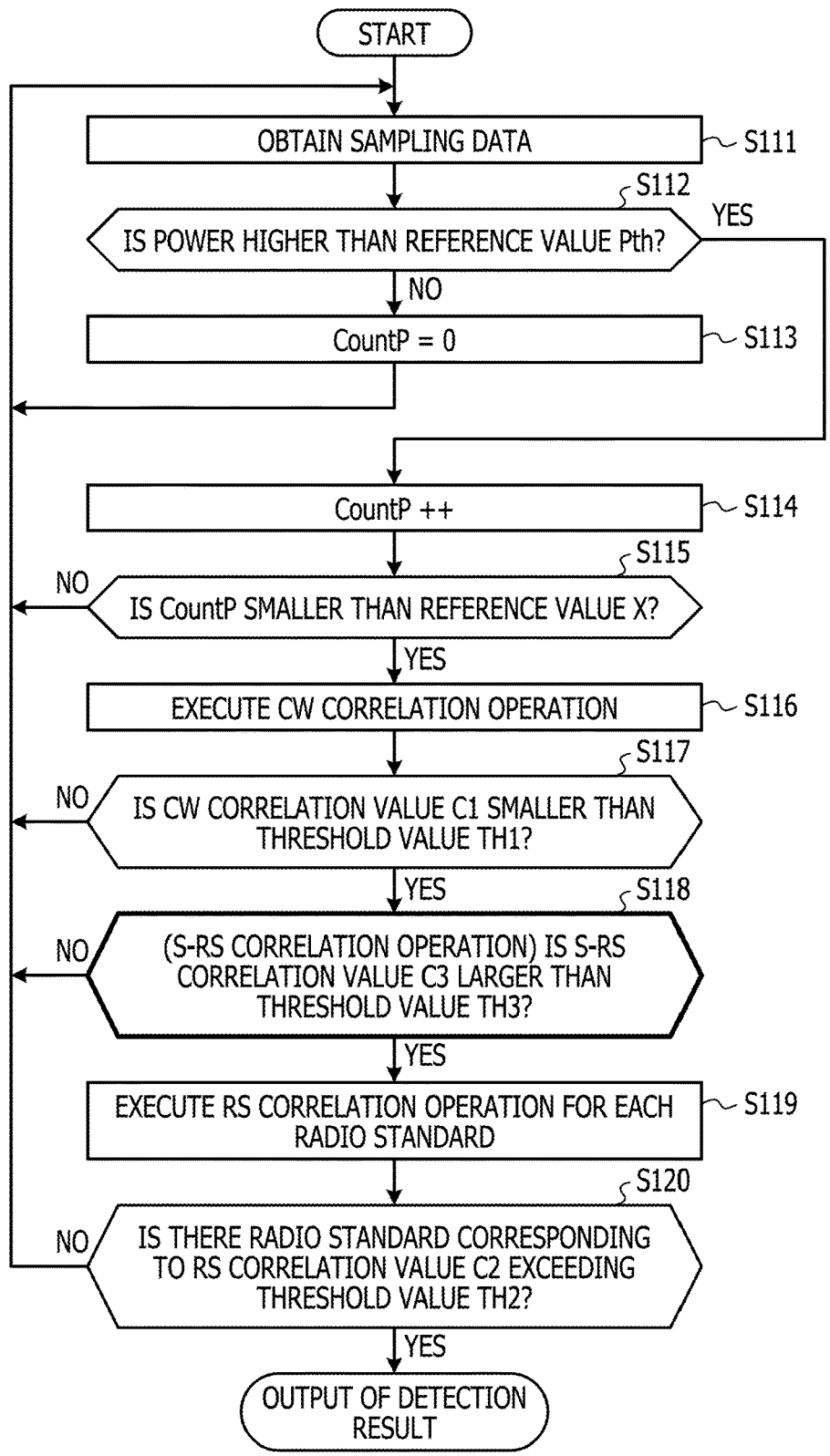
FIG. 14 is a flowchart illustrating a flow of processing performed by a radio analyzer according to one modification (modification example #1) of the second embodiment.

When the above-described modification example #1 is applied, the flow of the processing illustrated in FIG. 13 is modified as in FIG. 14. FIG. 14 is a flowchart illustrating a flow of processing performed by a radio analyzer according to one modification (modification example #1) of the second embodiment. The flow of the processing according to the modification example #1 will be described in the following with reference to FIG. 14.

(S111) The modulation section detecting unit 102 obtains the power value of an incoming wave as sampling data while shifting a sampling section.

(S112) The modulation section detecting unit 102 determines whether or not the power value (Power) is larger than a reference value Pth set in advance. The reference value Pth is set by using, as a reference, a power value in a state in which the output of the transmission signal is stabilized, for example. When the power value is larger than the reference value Pth, the processing proceeds to S114. When the power value is not larger than the reference value Pth, on the other hand, the processing proceeds to S113.

(S113) The modulation section detecting unit 102 resets, to zero, a parameter CountP used to determine a section in which the power value determination is made. When the processing of S113 is completed, the processing proceeds to S111.

(S114) The modulation section detecting unit 102 increments CountP by one.

(S115) The modulation section detecting unit 102 determines whether or not CountP is smaller than a reference value X. The reference value X is a parameter defining the time-out number of samplings (for example, the number of samplings corresponding to 150 microseconds). When CountP is smaller than the reference value X, the processing proceeds to S116. When CountP is not smaller than the reference value X, on the other hand, the processing proceeds to S111.

(S116 and S117) The modulation section detecting unit 102 calculates the CW correlation value C1 by executing the CW correlation operation (see FIG. 9). In addition, the modulation section detecting unit 102 determines whether or not the CW correlation value C1 is smaller than the threshold value TH1 (for example, 0.95). When the CW correlation value C1 is smaller than the threshold value TH1, the processing proceeds to S118. When the CW correlation value C1 is not smaller than the threshold value TH1, on the other hand, the processing proceeds to S111.

(S118) The modulation section detecting unit 102 calculates an S-RS correlation value C3 by executing S-RS correlation operation by a method similar to that of the CW correlation operation. The modulation section detecting unit 102 then determines whether or not the S-RS correlation value C3 is larger than a threshold value TH3. When the S-RS correlation value C3 is larger than the threshold value TH3, the processing proceeds to S119. When the S-RS correlation value C3 is not large than the threshold value TH3, on the other hand, the processing proceeds to S111.

Incidentally, the threshold value TH3 is set such that the modulated signal detection failure rate is a given value (for example, 0.1%) based on the probability density distributions illustrated in FIG. 4C, for example. In the example of FIG. 4C, the area of a region enclosed by a part in which the correlation value C is equal to or less than the threshold value in the graph of the thin solid line (RS for BT vs. S-RS) corresponds to the modulated signal detection failure rate. According to the probability density distributions of FIG. 4C, a probability of erroneously detecting CW as a modulated signal is not low in determination based on the S-RS correlation. However, the modification example #1 performs determination based on the S-RS correlation (S118) after determination based on the CW correlation (S117), and therefore contributes to improved detection accuracy.

(S119 and S120) The standard identifying unit 103 refers to the RS information 101a, and calculates the RS correlation value C2 by executing the RS correlation operation for each radio standard (see FIG. 11). In addition, the standard identifying unit 103 determines whether or not there is a radio standard corresponding to the RS correlation value C2 exceeding the threshold value TH2 (for example, 0.85). When there is a radio standard corresponding to the RS correlation value C2 exceeding the threshold value TH2, the standard identifying unit 103 outputs, as a result of detection, information about the radio standard corresponding to the RS correlation value C2 exceeding the threshold value TH2. When there is no radio standard corresponding to the RS correlation value C2 exceeding the threshold value TH2, on the other hand, the processing proceeds to S111.

A flow of processing according to the modification example #1 has been described above.

Modification Example #2: Abortion of Detection

Another modification (modification example #2) will next be described. In the flow of the processing illustrated in FIG. 13, even when no modulated signal is detected at all in a modulation section, the RS correlation operation is executed until the power value of the sampling data falls below the reference value Pth.

In many cases, a modulation section is started within a few microseconds of an end of a non-modulation section. There is thus a strong possibility that the modulated signal of an assumed radio standard is not included in the incoming wave in a case where no modulated signal is detected even when a certain time has passed since an end of the non-modulation section. For example, there is a small risk of missing a modulated signal even when detection processing is aborted in a case where no modulated signal is detected in a given section of about a few microseconds from a start of a modulation section. On the other hand, when the processing is aborted midway through, unnecessary processing may be omitted, which correspondingly reduces a processing load, and contributes to an increase in speed of the processing.

Figure 15:
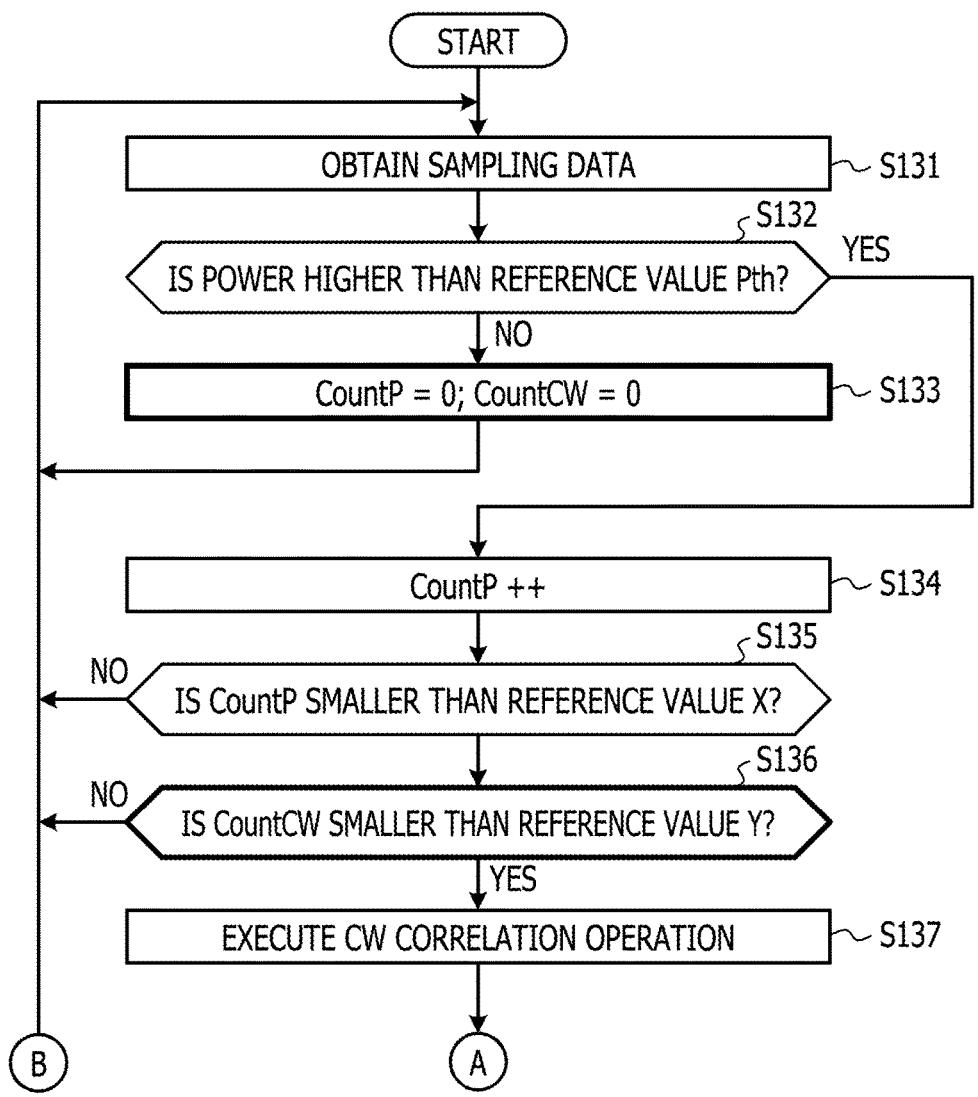
FIG. 15 is a first flowchart illustrating a flow of processing performed by a radio analyzer according to one modification (modification example #2) of the second embodiment.
Figure 16:
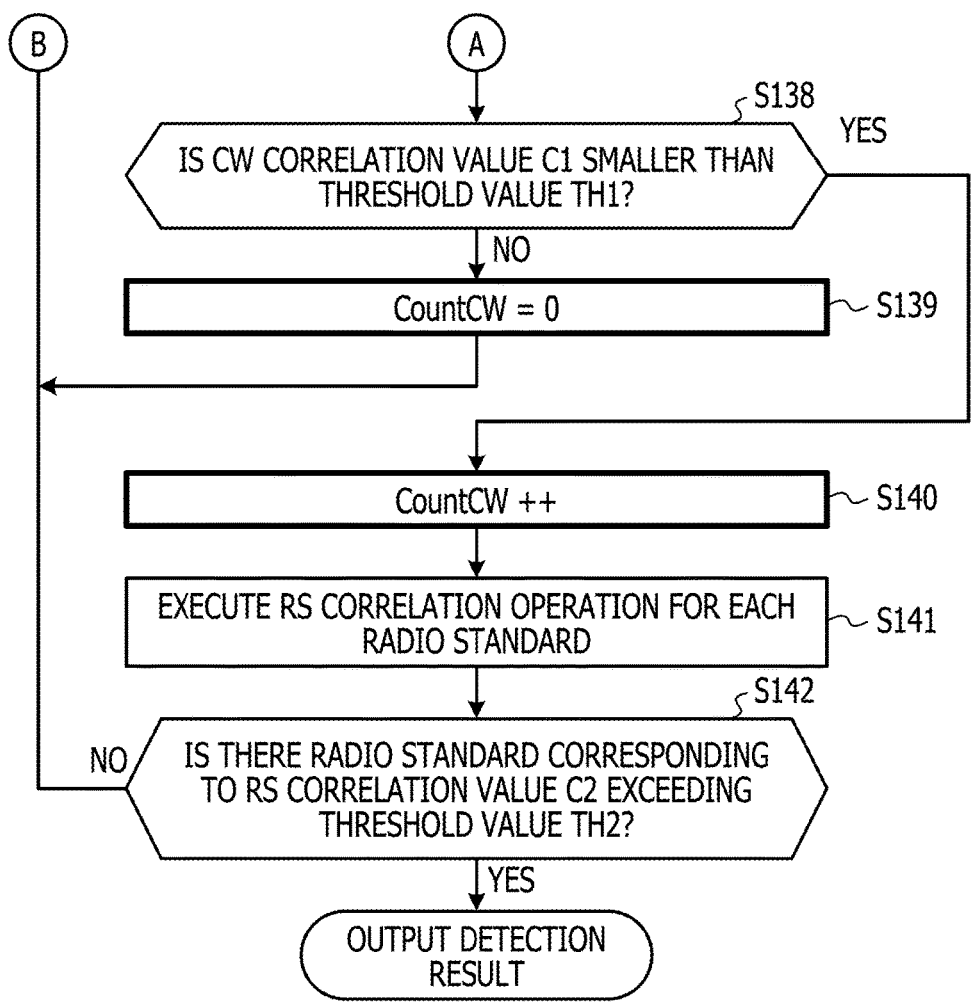
FIG. 16 is a second flowchart illustrating a flow of processing performed by a radio analyzer according to one modification (modification example #2) of the second embodiment.

For the above-described reasons, in the modification example #2, a mechanism is introduced which discontinues processing when no modulated signal is detected in a part near a start of a modulation section. A flow of processing according to the modification example #2 will be described in the following with reference to FIG. 15 and FIG. 16. FIG. 15 is a first flowchart illustrating a flow of processing performed by a radio analyzer according to one modification (modification example #2) of the second embodiment. FIG. 16 is a second flowchart illustrating a flow of processing performed by a radio analyzer according to one modification (modification example #2) of the second embodiment.

(S131) The modulation section detecting unit 102 obtains the power value of an incoming wave as sampling data while shifting a sampling section.

(S132) The modulation section detecting unit 102 determines whether or not the power value (Power) is larger than a reference value Pth set in advance. The reference value Pth is set by using, as a reference, a power value in a state in which the output of the transmission signal is stabilized, for example. When the power value is larger than the reference value Pth, the processing proceeds to S134. When the power value is not larger than the reference value Pth, on the other hand, the processing proceeds to S133.

(S133) The modulation section detecting unit 102 resets, to zero, a parameter CountP used to determine a section in which the power value determination is made. In addition, the modulation section detecting unit 102 resets, to zero, a parameter CountCW used to determine discontinuation timing. When the processing of S133 is completed, the processing proceeds to S131.

(S134) The modulation section detecting unit 102 increments CountP by one.

(S135) The modulation section detecting unit 102 determines whether or not CountP is smaller than a reference value X. The reference value X is a parameter defining the time-out number of samplings (for example, the number of samplings corresponding to approximately 120 microseconds (maximum length of a non-modulation section)). When CountP is smaller than the reference value X, the processing proceeds to S136. When CountP is not smaller than the reference value X, on the other hand, the processing proceeds to S131.

(S136) The modulation section detecting unit 102 determines whether or not CountCW is smaller than a reference value Y. The reference value Y is, for example, set to a number of samplings corresponding to the signal length (approximately 5 microseconds) of CW-RS. When CountCW is smaller than the reference value Y, the processing proceeds to S137. When CountCW is not smaller than the reference value Y, on the other hand, the processing proceeds to S131. As a result of the addition of this determination, even in a section in which the power value is larger than the threshold value Pth, only a non-modulation section and a part of a modulation section (part where CountCW<Y) are an object for processing from S137 on down. The addition of this determination thus contributes to a reduction in a processing load and shortening of processing time.

(S137 and S138) The modulation section detecting unit 102 calculates the CW correlation value C1 by executing the CW correlation operation (see FIG. 9). In addition, the modulation section detecting unit 102 determines whether or not the CW correlation value C1 is smaller than the threshold value TH1 (for example, 0.95). When the CW correlation value C1 is smaller than the threshold value TH1, the processing proceeds to S140. When the CW correlation value C1 is not smaller than the threshold value TH1, on the other hand, the processing proceeds to S139.

(S139) The modulation section detecting unit 102 resets CountCW to zero. When the processing of S139 is completed, the processing proceeds to S131.

(S140) The modulation section detecting unit 102 increments CountCW by one.

(S141 and S142) The standard identifying unit 103 refers to the RS information 101a, and calculates the RS correlation value C2 by executing the RS correlation operation for each radio standard (see FIG. 11). In addition, the standard identifying unit 103 determines whether or not there is a radio standard corresponding to the RS correlation value C2 exceeding the threshold value TH2 (for example, 0.85). When there is a radio standard corresponding to the RS correlation value C2 exceeding the threshold value TH2, the standard identifying unit 103 outputs, as a result of detection, information about the radio standard corresponding to the RS correlation value C2 exceeding the threshold value TH2. When there is no radio standard corresponding to the RS correlation value C2 exceeding the threshold value TH2, on the other hand, the processing proceeds to S131.

A flow of processing according to the modification example #2 has been described above.

Modification Example #3: Downsampling

Another modification (modification example #3) will next be described. The description thus far has been made by taking as an example a case where the sampling rate of the sampling data used in the CW correlation operation and the RS correlation operation is the same.

Figure 17:
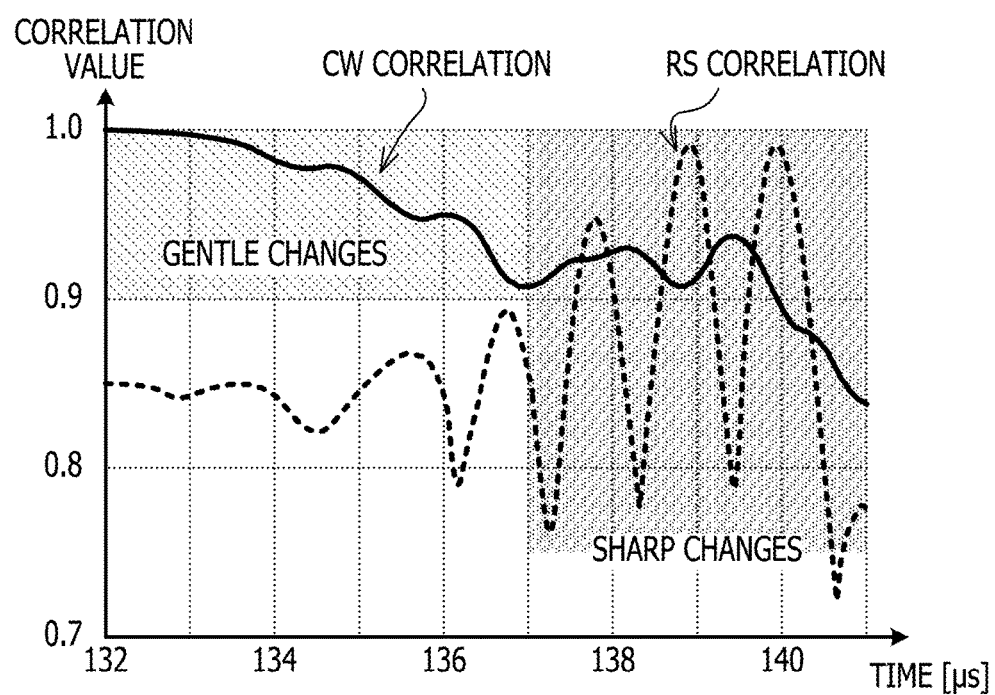
FIG. 17 is a diagram comparing temporal changes in a CW correlation value with temporal changes in an RS correlation value.

However, as illustrated in FIG. 17, temporal changes in the CW correlation value are gentler than temporal changes in the RS correlation value in the modulation section (dark hatched part). FIG. 17 is a diagram comparing temporal changes in the CW correlation value with temporal changes in the RS correlation value. In consideration of such a nature of the CW correlation value, in the modification example #3, a mechanism is introduced which downsamples the sampling data used in the CW correlation operation.

Figure 18:
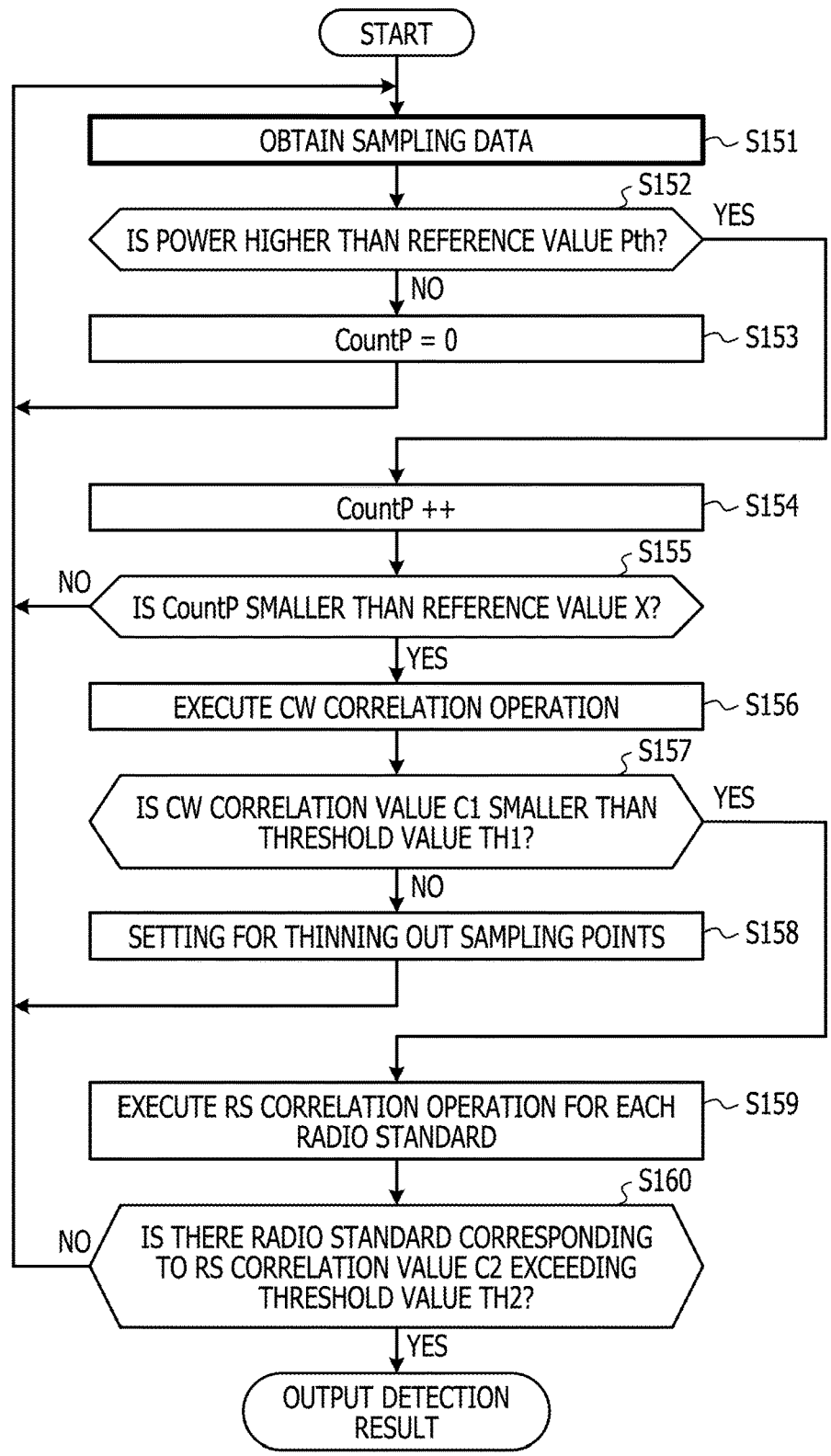
FIG. 18 is a flowchart illustrating a flow of processing performed by a radio analyzer according to one modification (modification example #3) of the second embodiment.

A flow of processing according to the modification example #3 will be described in the following with reference to FIG. 18. FIG. 18 is a flowchart illustrating a flow of processing performed by a radio analyzer according to one modification (modification example #3) of the second embodiment.

(S151) The modulation section detecting unit 102 obtains the power value of an incoming wave as sampling data while shifting a sampling section. At this time, when a setting for thinning out sampling points is made, the power value of the incoming wave is sampled at intervals of given points (for example, two points), and is used as the sampling data.

(S152) The modulation section detecting unit 102 determines whether or not the power value (Power) is larger than a reference value Pth set in advance. The reference value Pth is set by using, as a reference, a power value in a state in which the output of the transmission signal is stabilized, for example. When the power value is larger than the reference value Pth, the processing proceeds to S154. When the power value is not larger than the reference value Pth, on the other hand, the processing proceeds to S153.

(S153) The modulation section detecting unit 102 resets, to zero, a parameter CountP used to determine a section in which the power value determination is made. When the processing of S153 is completed, the processing proceeds to S151.

(S154) The modulation section detecting unit 102 increments CountP by one.

(S155) The modulation section detecting unit 102 determines whether or not CountP is smaller than a reference value X. The reference value X is a parameter defining the time-out number of samplings (for example, the number of samplings corresponding to approximately 120 microseconds (maximum length of a non-modulation section)). When CountP is smaller than the reference value X, the processing proceeds to S156. When CountP is not smaller than the reference value X, on the other hand, the processing proceeds to S151.

(S156 and S157) The modulation section detecting unit 102 calculates the CW correlation value C1 by executing the CW correlation operation (see FIG. 9). In addition, the modulation section detecting unit 102 determines whether or not the CW correlation value C1 is smaller than the threshold value TH1 (for example, 0.95). When the CW correlation value C1 is smaller than the threshold value TH1, the processing proceeds to S159. When the CW correlation value C1 is not smaller than the threshold value TH1, on the other hand, the processing proceeds to S158.

(S158) The modulation section detecting unit 102 effects a setting for thinning out sampling points. For example, when detecting a non-modulation section by the processing of S157, the modulation section detecting unit 102 makes a setting such that sampling points are thinned out when the sampling data is obtained in S151. This setting reduces the number of times of the CW correlation operation executed in S156, and therefore contributes to a reduction in a processing load and shortening of processing time. When the processing of S158 is completed, the processing proceeds to S151.

(S159 and S160) The standard identifying unit 103 refers to the RS information 101a, and calculates the RS correlation value C2 by executing the RS correlation operation for each radio standard (see FIG. 11). In addition, the standard identifying unit 103 determines whether or not there is a radio standard corresponding to the RS correlation value C2 exceeding the threshold value TH2 (for example, 0.85). When there is a radio standard corresponding to the RS correlation value C2 exceeding the threshold value TH2, the standard identifying unit 103 outputs, as a result of detection, information about the radio standard corresponding to the RS correlation value C2 exceeding the threshold value TH2. When there is no radio standard corresponding to the RS correlation value C2 exceeding the threshold value TH2, on the other hand, the processing proceeds to S151.

Figure 19:
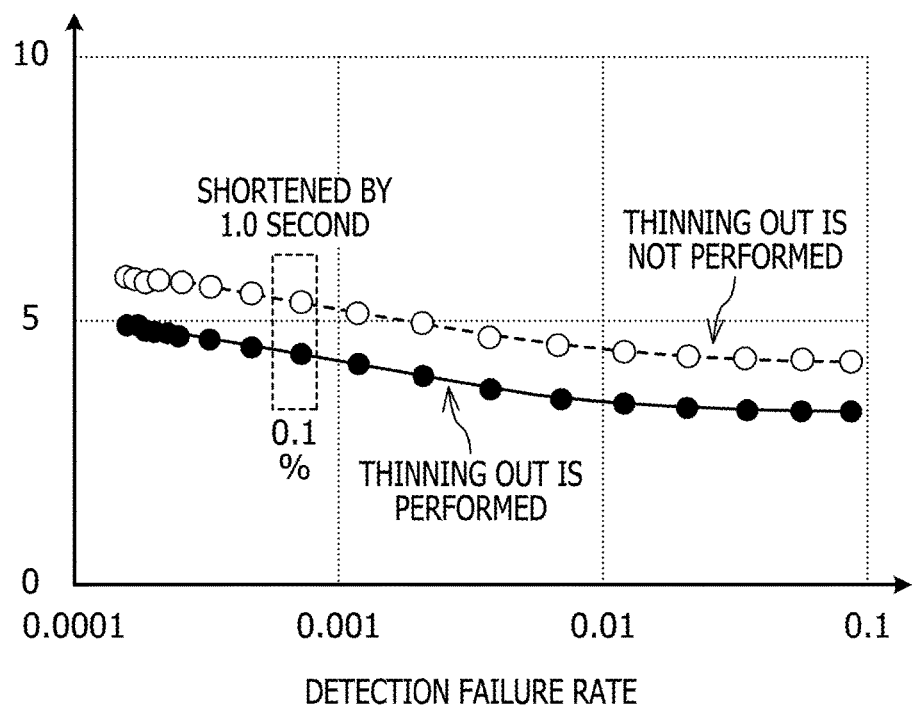
FIG. 19 is a diagram of assistance in explaining an effect of shortening processing time, the effect being obtained by adopting detection processing according to one modification (modification example #3) of the second embodiment.

When the mechanism of the above-described modification example #3 is introduced, an effect of shortening processing time is obtained, as illustrated in FIG. 19. FIG. 19 is a diagram of assistance in explaining an effect of shortening processing time, the effect being obtained by adopting detection processing according to one modification (modification example #3) of the second embodiment. In FIG. 19, a solid line (thinning out is performed) represents a result in a case where the mechanism of the modification example #3 is introduced, and a broken line (thinning out is not performed) represents a result in a case where the mechanism of the modification example #3 is not introduced. When the threshold value TH2 corresponding to a detection failure rate of 0.1% is set, a difference of about one second in processing time (an improvement of approximately 20%) occurs.

The degree of the effect depends on the power distribution of the incoming wave, the settings of the respective threshold values, a thinning-out rate, and the like. However, because the thinning out of sampling points may reduce the number of times of the CW correlation operation, a reliable effect of shortening processing time is expected.

As described above, the technology according to the second embodiment is susceptible of modifications as described above. In addition, at least two of the modification examples #1, #2, and #3 may be combined with each other and applied. In addition, the settings of the reference values X, Y, and Pth and the threshold values TH1, TH2, and TH3 are not limited to the above-described examples, but the reference values X, Y, and Pth and the threshold values TH1, TH2, and TH3 may be set at suitable values in consideration of a tolerable detection failure rate, a desired processing load, and the like. In addition, the number, arrangement, hardware, and the like of the devices included in the system may be modified as appropriate. In addition, kinds of applicable radio standards are not limited to the foregoing examples, but may include various radio standards standardized at present or in the future. Such modifications naturally belong to the technical scope of the second embodiment.

The second embodiment has been described above.

All examples and conditional language recited herein are intended for pedagogical purposes to and the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A radio analyzer comprising:
   a memory configured to store a first reference signal; and
   a processor coupled to the memory and configured to:
   obtain a received wave,
   obtain a first correlation value between a non-modulated wave and a first wave by performing a first correlation operation on the first wave with the non-modulated wave, a time period of the non-modulated wave being smaller in length than the first reference signal, the first wave being a first part of the received wave,
   detect a first section in accordance with the first correlation value, the first section being a time period in which the first correlation value is smaller than a first threshold value,
   obtain a second correlation value between the first reference signal and a second wave by performing a second correlation operation on the second wave with the first reference signal, the second wave being a second part of the received wave, the second part belonging to the detected first section, and
   detect a modulated wave from the received wave based on the second correlation value.

2. The radio analyzer according to claim 1, wherein the processor discontinues processing of the obtaining the second correlation value when the modulated wave is not extracted in a section of a given length that continues from a start point of the first section.

3. The radio analyzer according to claim 1, wherein intervals between sampling points sampled from the received wave and the non-modulated wave when the first correlation value is obtained are larger than intervals between sampling points sampled from the received wave and the first reference signal when the second correlation value is obtained.

4. The radio analyzer according to claim 1, wherein the memory stores information about a second reference signal having a second length shorter than a first length of the first reference signal, the first and second lengths are lengths of time, and
the processor
obtains a third correlation value by performing a third correlation operation on the second wave with the second reference signal, and
obtains the second correlation value in the first section in which the third correlation value is larger than a second threshold value.

5. A detecting method comprising:
obtaining a received wave;
reading, by a processor, a first reference signal from a memory;
obtaining, by a processor, a first correlation value between a non-modulated wave and a first wave by performing a first correlation operation on the first wave with the non-modulated wave, a time period of the non-modulated wave being smaller in length than the first reference signal, the first wave being a first part of the received wave;
detecting, by a processor, a first section in accordance with the first correlation value, the first section being a time period in which the first correlation value is smaller than a first threshold value,
obtaining, by a processor, a second correlation value between the first reference signal and a second wave by performing a second correlation operation on the second wave with the first reference signal, the second wave being a second part of the received wave, the second part belonging to the detected first section; and detecting, by a processor, a modulated wave from the received wave based on the second correlation value.

\* \* \* \* \*